United States Patent
Song et al.

(10) Patent No.: US 11,957,039 B2
(45) Date of Patent: Apr. 9, 2024

(54) ORGANIC LIGHT-EMITTING DISPLAY SUBSTRATES AND METHODS OF PREPARING THE SAME, AND ORGANIC LIGHT-EMITTING DISPLAY APPARATUSES

(71) Applicant: BOE Technology Group Co., Ltd., Beijing (CN)

(72) Inventors: Zunqing Song, Beijing (CN); Fangxu Cao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 276 days.

(21) Appl. No.: 17/412,120

(22) Filed: Aug. 25, 2021

(65) Prior Publication Data
US 2022/0123238 A1    Apr. 21, 2022

(30) Foreign Application Priority Data
Oct. 21, 2020   (CN) .......................... 202011131993.8

(51) Int. Cl.
*H10K 77/10*       (2023.01)
*H10K 50/844*     (2023.01)
(Continued)

(52) U.S. Cl.
CPC ......... *H10K 77/111* (2023.02); *H10K 50/844* (2023.02); *H10K 59/12* (2023.02);
(Continued)

(58) Field of Classification Search
CPC .... H10K 77/111; H10K 50/844; H10K 59/12; H10K 71/00; H10K 71/80; H10K 59/1201; H10K 2102/311; Y02E 10/549
See application file for complete search history.

(56) References Cited

U.S. PATENT DOCUMENTS 11,508,918 B2 * 11/2022 Jiang .................... H10K 59/124
2021/0050558 A1    2/2021 Zhang et al.
(Continued)

FOREIGN PATENT DOCUMENTS

CN    110137186 A    8/2019
CN    110311061 A    10/2019

OTHER PUBLICATIONS

Definition of hollow downloaded from URL<https://www.merriam-webster.com/dictionary/hollow> on Aug. 2, 2023. (Year: 2023).*
(Continued)

*Primary Examiner* — J. E. Schoenholtz
(74) *Attorney, Agent, or Firm* — IPro, PLLC (57) ABSTRACT

Organic light-emitting display substrates and methods of preparing the same, and organic light-emitting display apparatuses are provided. An organic light-emitting display substrate includes a display area and opening areas in the display area. A method of preparing the organic light-emitting display substrate includes: forming a flexible substrate on a support substrate, where the flexible substrate includes openings located in the opening areas respectively; forming an organic light-emitting device layer on a side of the flexible substrate away from the support substrate; forming an encapsulation layer on a side of the organic light-emitting device layer away from the flexible substrate, such that the encapsulation layer covers the organic light-emitting device layer and the openings, where the encapsulation layer includes first to-be-etched portions; etching the first to-be-etched portions to remove the first to-be-etched portions; and peeling off the support substrate from the flexible substrate to obtain the organic light-emitting display substrate.

13 Claims, 6 Drawing Sheets

(51) Int. Cl.
  *H10K 59/12*    (2023.01)
  *H10K 71/00*    (2023.01)
  *H10K 71/80*    (2023.01)
  *H10K 102/00*   (2023.01)

(52) U.S. Cl.
  CPC ............ *H10K 71/00* (2023.02); *H10K 71/80* (2023.02); *H10K 59/1201* (2023.02); *H10K 2102/311* (2023.02)

(56) References Cited

U.S. PATENT DOCUMENTS

| | | | |
|---|---|---|---|
| 2021/0272485 A1 | 9/2021 | Song et al. | |
| 2021/0408444 A1* | 12/2021 | Ouyang | H10K 50/865 |
| 2022/0085342 A1* | 3/2022 | Kim | H10K 50/844 |
| 2022/0320465 A1* | 10/2022 | Hou | H10K 71/00 |
| 2023/0156347 A1* | 5/2023 | Uhm | H10K 59/80 |
| | | | 348/302 |

OTHER PUBLICATIONS

CN2020111319938 first office action.

\* cited by examiner

ORGANIC LIGHT-EMITTING DISPLAY SUBSTRATES AND METHODS OF PREPARING THE SAME, AND ORGANIC LIGHT-EMITTING DISPLAY APPARATUSES

CROSS-REFERENCE TO RELATED APPLICATIONS

The present disclosure claims a priority to Chinese patent application No. 202011131993.8 filed on Oct. 21, 2020 and entitled "ORGANIC LIGHT-EMITTING DISPLAY SUBSTRATES AND METHODS OF PREPARING THE SAME, AND ORGANIC LIGHT-EMITTING DISPLAY APPARATUSES", which is incorporated herein by reference in its entirety.

TECHNICAL FIELD

The present disclosure relates to the field of display technology, and in particular to an organic light-emitting display substrate and method of preparing the same, and an organic light-emitting display apparatus.

BACKGROUND

In the related art, flexible OLED display apparatuses have advantages such as low power consumption, wide color gamut, lightness and thinness, and deformability, and have been widely used in portable electronic devices, wearable devices, instant messaging devices, virtual reality devices, etc. A stretchable and flexible display apparatus, as a new direction in the development of display technology, is a deformable and bendable display apparatus made of flexible materials, and may be increased in size.

The stretchable and flexible display apparatus may include a flexible substrate and an encapsulation layer, the flexible substrate may include openings, and the encapsulation layer may cover the openings.

SUMMARY

The present disclosure provides an organic light-emitting display substrate and method of preparing the same, and an organic light-emitting display apparatus.

According to a first aspect of embodiments of the present disclosure, there is provided a method of preparing an organic light-emitting display substrate including a display area and a plurality of opening areas located in the display area, the method including:
  forming a flexible substrate on a support substrate, such that the support substrate supports the flexible substrate, where the flexible substrate includes a plurality of openings each of which is located in a respective opening area;
  forming an organic light-emitting device layer on a side of the flexible substrate away from the support substrate, such that the organic light-emitting device layer is located in the display area;
  forming an encapsulation layer on a side of the organic light-emitting device layer away from the flexible substrate, such that the encapsulation layer covers the organic light-emitting device layer and the openings, where the encapsulation layer includes first to-be-etched portions, each of which is located in a respective opening and extends in a direction intersecting side walls of the opening;
  etching the first to-be-etched portions to remove the first to-be-etched portions; and
  peeling off the support substrate from the flexible substrate to obtain the organic light-emitting display substrate.

In an embodiment, each of the openings is a blind hole, a distance between a bottom surface of the opening and a surface of the flexible substrate in contact with the support substrate is greater than zero, and each of the first to-be-etched portions is located on the bottom surface of the respective opening;
  the flexible substrate includes second to-be-etched portions, each of which is located between the bottom surface of the respective opening and the support substrate, and orthographic projections of the first to-be-etched portions on the support substrate coincide with orthographic projections of the second to-be-etched portions on the support substrate; and
  after etching the first to-be-etched portions to remove the first to-be-etched portions, the method may further include:
  etching the second to-be-etched portions to remove the second to-be-etched portions.

In an embodiment, the flexible substrate includes a first organic layer, a first barrier layer, a second organic layer, and a second barrier layer; and
  the first organic layer is located on the support substrate, the first barrier layer is located on a side of the first organic layer away from the support substrate, the second organic layer is located on a side of the first barrier layer away from the support substrate, and the second barrier layer is located on a side of the second organic layer away from the support substrate, and the bottom surface of each of the openings is located in the first organic layer or the first barrier layer.

In an embodiment, when the bottom surface of each of the openings is located in the first organic layer and between a surface of the first organic layer away from the support substrate and a surface of the first organic layer close to the support substrate, the opening includes a first hole portion and a second hole portion, the first hole portion is a blind hole that penetrates through the first barrier layer and does not penetrate through the first organic layer, and the second hole portion is a through hole that penetrates through the second barrier layer and the second organic layer.

In an embodiment, the first hole portion has a hole size smaller than that of the second hole portion such that the first barrier layer is formed with a corresponding exposed portion that is not covered by the second organic layer; and
  the encapsulation layer includes a corresponding enclosed protection portion located on a side of the exposed portion away from the support substrate.

In an embodiment, before forming the organic light-emitting device layer on the side of the flexible substrate away from the support substrate, the method may further include:
  etching the flexible substrate to obtain the openings.

In an embodiment, etching the flexible substrate to obtain the openings includes:
  etching the second barrier layer and the second organic layer to obtain second hole portions, where an etching gas used in etching the second organic layer etches the second organic layer at an etching rate greater than that for the second barrier layer, such that an orthographic projection of the second barrier layer on the support substrate covers an orthographic projection of the second organic layer on the support substrate; and etching the first barrier layer and the first organic layer to obtain first hole portions, where an etching gas used in etching the first organic layer etches the first organic layer at an etching rate greater than that for the first barrier layer, such that an orthographic projection of the first barrier layer on the support substrate covers an orthographic projection of the first organic layer on the support substrate.

In an embodiment, the first barrier layer is made of silicon oxide, silicon nitride, or silicon oxynitride, and the etching gas used in etching the first organic layer includes oxygen gas; and the second barrier layer is made of silicon oxide, silicon nitride, or silicon oxynitride, and the etching gas used in etching the second organic layer includes oxygen gas.

In an embodiment, the etching gas used in etching the first organic layer further includes a first auxiliary gas with a proportion less than that of the oxygen gas, and the first auxiliary gas includes at least one of carbon tetrafluoride $CF_4$, sulfur hexafluoride $SF_6$ or trifluoromethane $CHF_3$; and the etching gas used in etching the second organic layer further includes a second auxiliary gas with a proportion less than that of the oxygen gas, and the second auxiliary gas includes at least one of carbon tetrafluoride $CF_4$, sulfur hexafluoride $SF_6$, or trifluoromethane $CHF_3$.

In an embodiment, the first hole portion has a hole size equal to that of the second hole portion.

In an embodiment, the flexible substrate includes a first organic layer and a first barrier layer, the first organic layer is located on the support substrate, and the first barrier layer is located on a side of the first organic layer away from the support substrate; and the bottom surface of the opening is located in the first organic layer and between a surface of the first organic layer away from the support substrate and a surface of the first organic layer close to the support substrate.

In an embodiment, the opening is a through hole, and the first to-be-etched portions are located on the support substrate.

In an embodiment, the flexible substrate includes a first organic layer and a first barrier layer;

the first organic layer is located on the support substrate, and the first barrier layer is located on a side of the first organic layer away from the support substrate; and the opening penetrates through the first organic layer and the first barrier layer.

According to a second aspect of embodiments of the present disclosure, there is provided an organic light-emitting display substrate including a display area and a plurality of opening areas located in the display area, the display area including:

a flexible substrate including a plurality of penetration holes each of which is located in a respective opening area;

an organic light-emitting device layer provided on the flexible substrate; and an encapsulation layer provided on a side of the organic light-emitting device layer away from the flexible substrate, where the encapsulation layer covers the organic light-emitting device layer and at least part of side walls of each of the penetration holes, and includes a plurality of hollowed-out portions, and an orthographic projection of each of the hollowed-out portions on the flexible substrate is located in the respective opening area.

According to a third aspect of embodiments of the present disclosure, there is provided an organic light-emitting display apparatus including the organic light-emitting display substrate as described above.

It should be understood that the above general description and the following detailed description are merely exemplary and explanatory, and are not intended to limit the present disclosure.

BRIEF DESCRIPTION OF DRAWINGS

The drawings herein, which are incorporated into the specification and constitute a part of the specification, illustrate embodiments in accordance with the present disclosure, and are used together with the specification to explain the principle of the present disclosure.

DETAILED DESCRIPTION

Exemplary embodiments will be described in detail herein, and examples thereof are illustrated in the drawings. When the following description refers to the drawings, the same numbers in different drawings indicate the same or similar elements, unless otherwise indicated. The implementations described in the following exemplary embodiments do not represent all implementations in accordance with the present disclosure. Rather, they are merely examples of apparatuses and methods in accordance with some aspects of the present disclosure as detailed in the appended claims.

Figure 1:
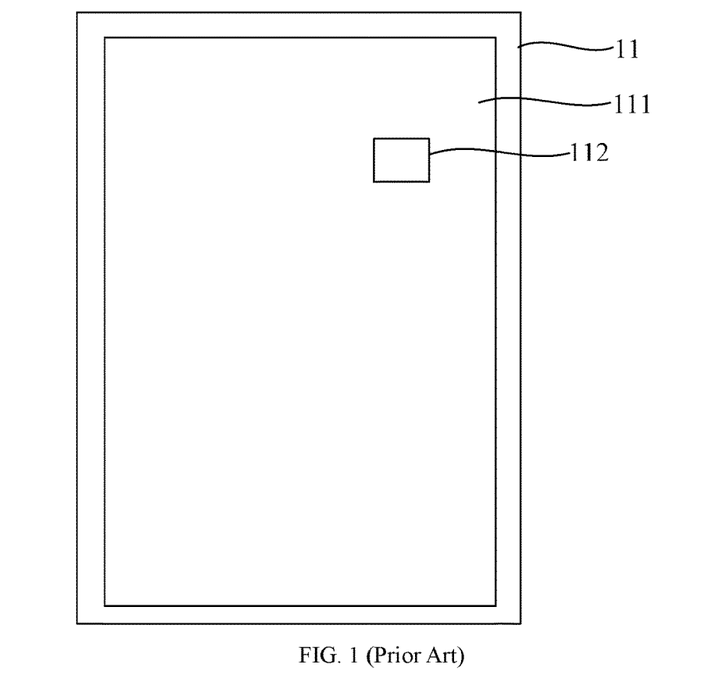
FIG. 1 is a schematic structural diagram illustrating an organic light-emitting display substrate according to the related art.

As shown in FIG. 1, in the related art, in order to make an organic light-emitting display substrate 11 stretchable, the organic light-emitting display substrate 11 may be provided with a plurality of opening areas 112 in a display area 111, and a flexible substrate may be provided with openings (not shown) in the opening areas 112 to achieve a certain amount of stretching. In the process of preparing the organic light-emitting display substrate 11, the flexible substrate is disposed on a rigid support substrate, and a part of an encapsulation layer is adhered to the rigid support substrate through the openings. When the rigid support substrate is separated from the flexible substrate, a part of the encapsulation layer is easily peeled off, which in turn leads to the failure of the encapsulation layer and reduces the reliability of the display apparatus.

Figure 2:
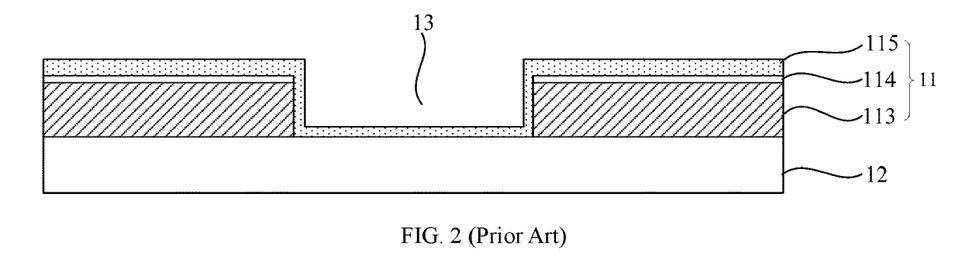
FIG. 2 is a cross-sectional view illustrating an organic light-emitting display substrate according to the related art.
Figure 3:
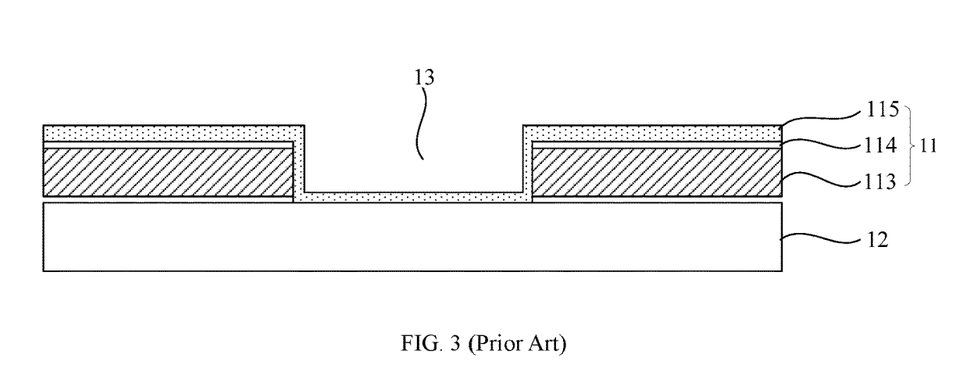
FIG. 3 is another cross-sectional view illustrating an organic light-emitting display substrate according to the related art.

As shown in FIGS. 2 and 3, in the process of preparing the organic light-emitting display substrate 11, a layer of polyimide (PI) film 113 is first coated on a glass substrate 12, then required components is prepared on the polyimide film 113, and finally a laser is used to irradiate a back surface of the glass substrate 12, such that the polyimide film 113 may be peeled off from the glass substrate 12. The polyimide film 113 peeled off may be provided with thin-film transistors (not shown), organic light-emitting diodes (not shown) and an encapsulation layer 115. Such a peeling method is known as LLO (Laser Lift Off). When the laser is incident from the glass substrate 12 to a junction of the polyimide film 113 and the glass substrate 12, most of energy of the laser acts on the polyimide film 113 at the junction due to different absorption rates of the polyimide film 113 and the glass substrate 12 for the laser. Chemical bonds inside the polyimide film 113 are broken under the energy of an ultraviolet laser, and a surface temperature of the polyimide film 113 rises to reach a decomposition temperature of the polyimide film 113, such that the polyimide film 113 is peeled off from the glass substrate 12. In this regard, FIG. 2 illustrates a schematic diagram of the polyimide film 113 and the glass substrate 12 before separation, and FIG. 3 illustrates a schematic diagram of the polyimide film 113 and the glass substrate 12 after separation. A barrier layer 114 may be provided on the polyimide film 113 to prevent impurities in the polyimide film 113 from diffusing to a thin film transistor side.

Since the polyimide film 113 includes openings 13 provided therein, a part of the encapsulation layer 115 located in the openings 13 is directly coated on the glass substrate 12, and an inorganic layer in the encapsulation layer 115 may not be decomposed under a given laser energy, causing the encapsulation layer 115 to be adhered to the glass substrate 12 and peeled off when torn during the LLO process, which in turn leads to the failure of the encapsulation layer and reduces the reliability of the display apparatus.

Embodiments of the present disclosure provide an organic light-emitting display substrate and method of preparing the same, and an organic light-emitting display apparatus, which can overcome the defect of peeling off of an encapsulation layer when a support substrate is separated from a flexible substrate, and improve the reliability of the encapsulation layer.

Figure 4:
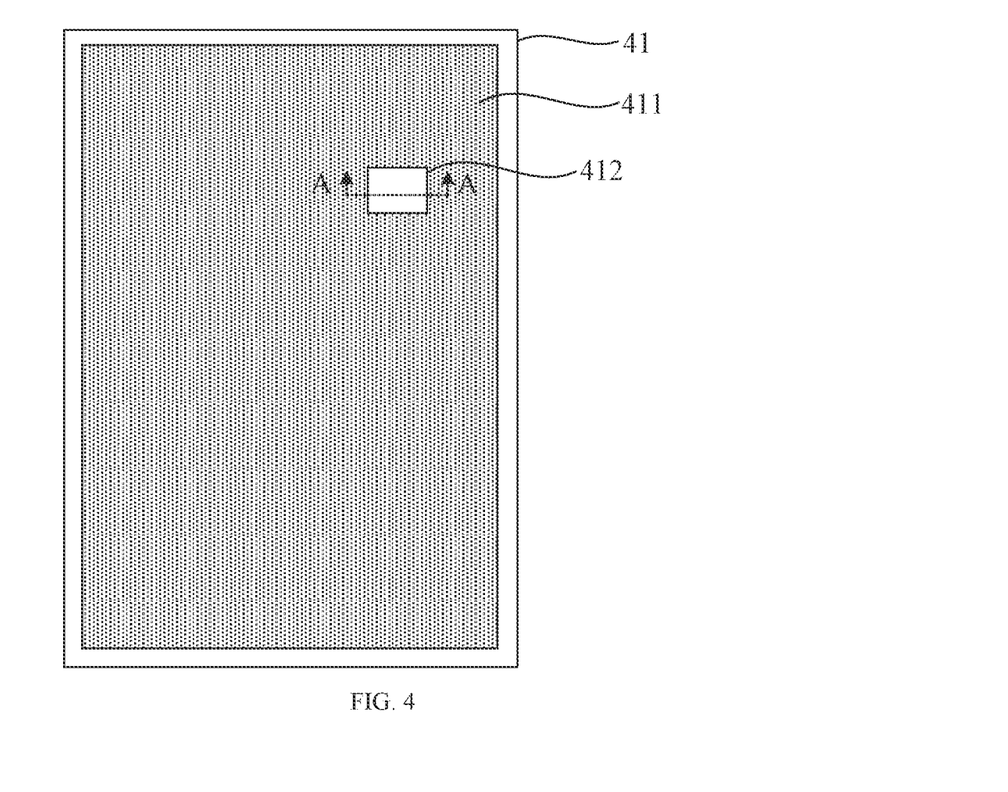
FIG. 4 is a schematic structural diagram illustrating an organic light-emitting display substrate according to an embodiment of the present disclosure.
Figure 5:
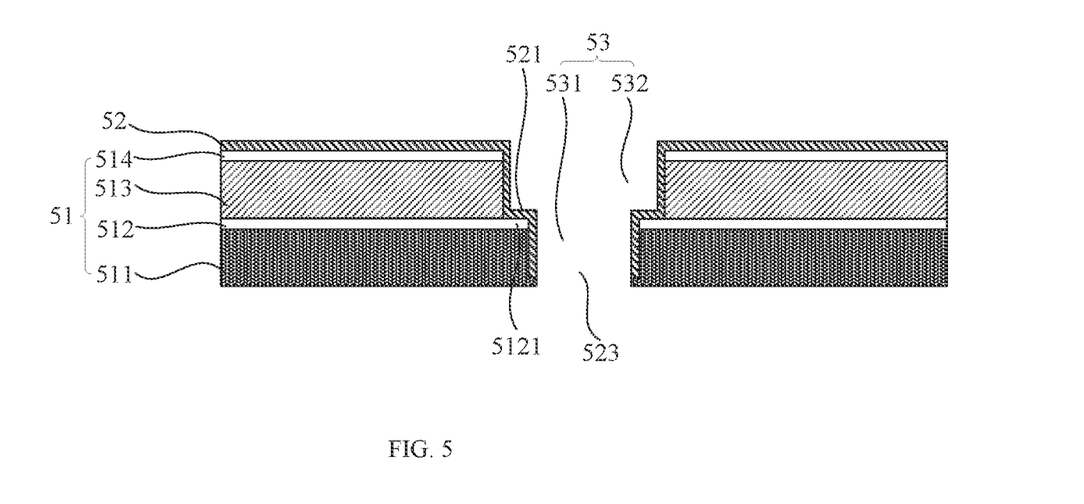
FIG. 5 is a cross-sectional view illustrating an organic light-emitting display substrate according to an embodiment of the present disclosure.

As shown in FIG. 4, embodiments of the present disclosure provide an organic light-emitting display substrate 41. The organic light-emitting display substrate 41 includes a display area 411 and a plurality of opening areas 412 located in the display area 411. FIG. 5 illustrates a cross-sectional view of one of the opening areas 412 along a section line A-A in FIG. 4. As shown in FIG. 5, the display area 411 includes a flexible substrate 51, an organic light-emitting device layer (not shown) and an encapsulation layer 52.

As shown in FIG. 5, the flexible substrate 51 includes a plurality of penetration holes 53 each of which is located in a respective opening area 412. The penetration hole 53 is a through hole that penetrates through the flexible substrate 51. The organic light-emitting device layer is provided on the flexible substrate 51. The encapsulation layer 52 is provided on a side of the organic light-emitting device layer away from the flexible substrate 51. The encapsulation layer 52 covers the organic light-emitting device layer and at least part of side walls of each of the penetration holes 53, and includes a plurality of hollowed-out portions 523, and an orthographic projection of each of the hollowed-out portions 523 on the flexible substrate 51 is located in the respective opening area.

In this embodiment, as shown in FIG. 5, the flexible substrate 51 may include a first organic layer 511, a first barrier layer 512, a second organic layer 513 and a second barrier layer 514. The first barrier layer 512 may be located on the first organic layer 511, the second organic layer 513 may be located on a side of the first barrier layer 512 away from the first organic layer 511, and the second barrier layer 514 may be located on a side of the second organic layer 513 away from the first barrier layer 512.

In this embodiment, as shown in FIG. 5, the penetration hole 53 may include a third hole portion 531 and a second hole portion 532. The third hole portion 531 is a through hole that penetrates through the first barrier layer 512 and the first organic layer 511, and the second hole portion 532 is a through hole that penetrates through the second barrier layer 514 and the second organic layer 513.

In this embodiment, as shown in FIG. 5, the third hole portion 531 may have a hole size smaller than that of the second hole portion 532 such that the first barrier layer 512 may be formed with an exposed portion 5121 that is not covered by the second organic layer 513.

In this embodiment, as shown in FIG. 5, the encapsulation layer 52 may include an enclosed protection portion 521 located on a side of the exposed portion 5121 away from the first organic layer 511. In this way, the encapsulation layer 52 may be in contact with the first barrier layer 512 such that the second organic layer 513, the second barrier layer 514, the organic light-emitting device layer and other film layers may be enclosed by the encapsulation layer 52 and the first barrier layer 512, which can protect the second organic layer 513, the second barrier layer 514 and the organic light-emitting device layer.

Figure 6:
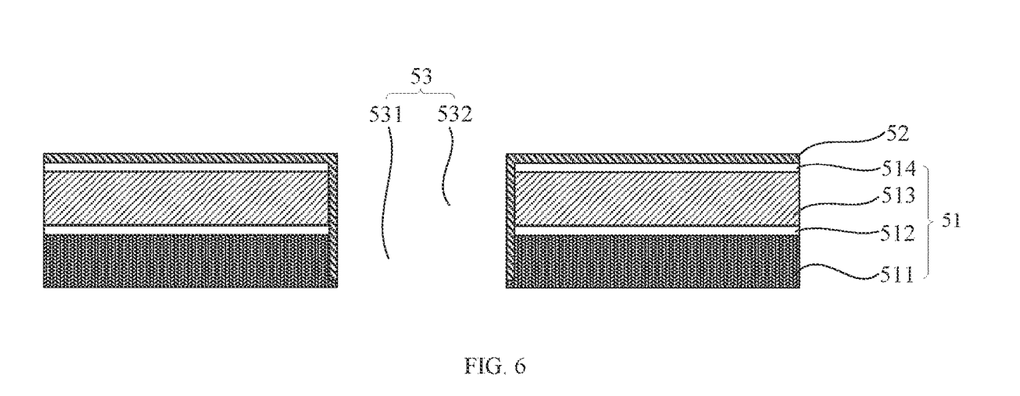
FIG. 6 is a cross-sectional view illustrating an organic light-emitting display substrate according to another embodiment of the present disclosure.

Embodiments of the present disclosure further provide an organic light-emitting display substrate 41. FIG. 6 illustrates a cross-sectional view of the opening area 412 along a section line A-A in FIG. 4. Embodiment as shown in FIG. 6 differs from the embodiment as shown in FIG. 5 in that, the third hole portion 531 has a hole size equal to that of the second hole portion 532.

Figure 7:
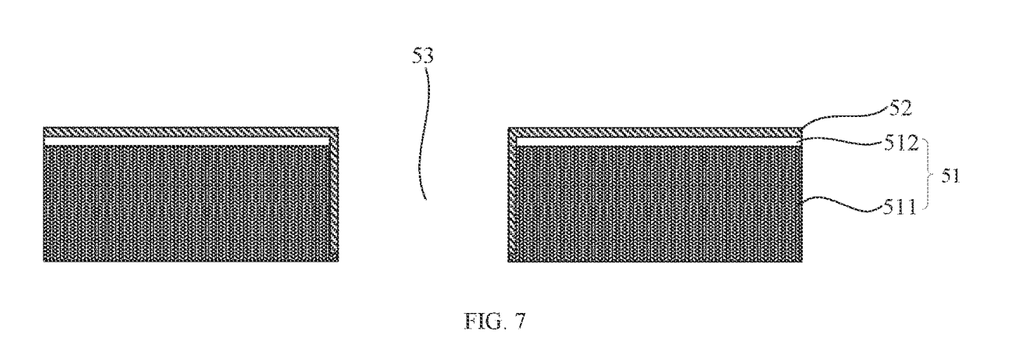
FIG. 7 is a cross-sectional view illustrating an organic light-emitting display substrate according to yet another embodiment of the present disclosure.

Embodiments of the present disclosure further provide an organic light-emitting display substrate 41. FIG. 7 illustrates a cross-sectional view of the opening area 412 along a section line A-A in FIG. 4. Embodiment as shown in FIG. 7 differs from the embodiment as shown in FIG. 5 in that, the flexible substrate 51 includes one organic layer and one barrier layer, for example, the flexible substrate 51 includes a first organic layer 511 and a first barrier layer 512. Moreover, the penetration hole 53 has substantially the same hole size in a direction from the first organic layer 511 toward the first barrier layer 512.

Figure 8:
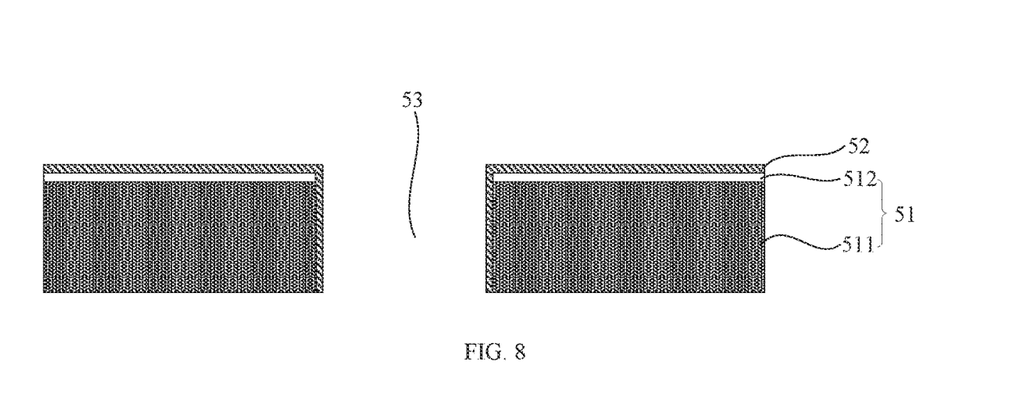
FIG. 8 is a cross-sectional view illustrating an organic light-emitting display substrate according to still another embodiment of the present disclosure.

Embodiments of the present disclosure further provide an organic light-emitting display substrate 41. FIG. 8 illustrates a cross-sectional view of the opening area 412 along a section line A-A in FIG. 4. Embodiment as shown in FIG. 8 differs from the embodiment as shown in FIG. 7 in that, the encapsulation layer 52 covers all of the side walls of the penetration hole 53.

The organic light-emitting display substrate 41 according to the embodiments of the present disclosure has been described above, and a method of preparing the organic light-emitting display substrate according to the embodiments of the present disclosure will be described below.

Figure 9:
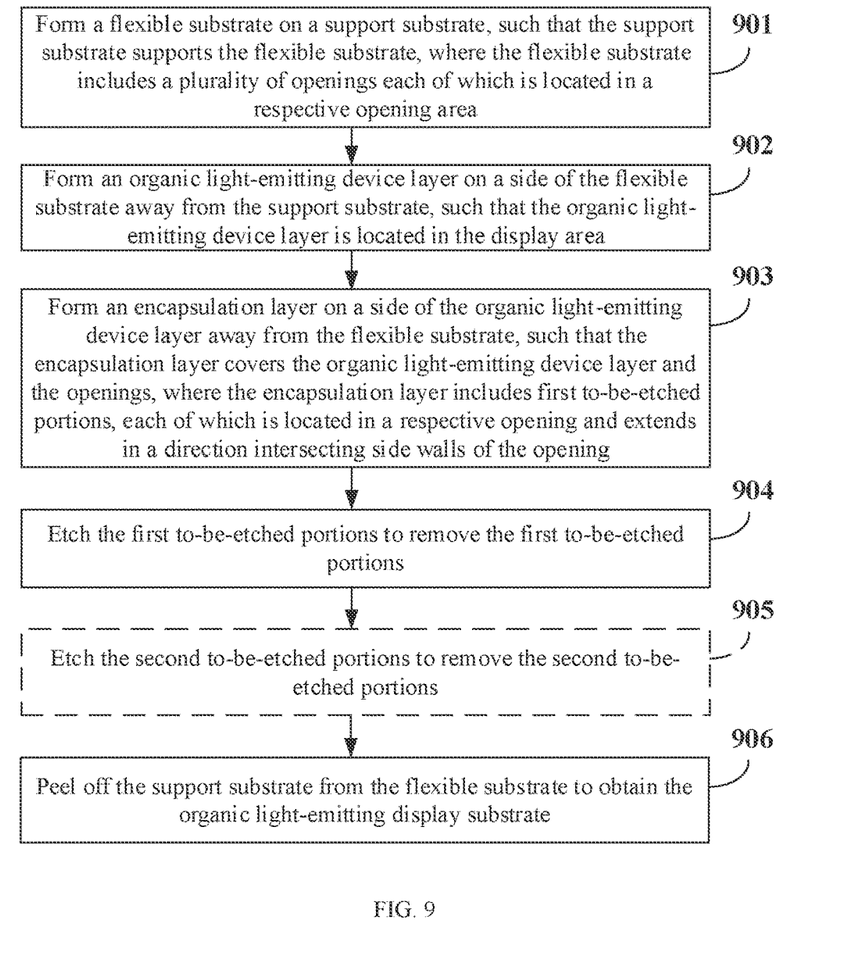
FIG. 9 is a flowchart illustrating a method of preparing an organic light-emitting display substrate according to an embodiment of the present disclosure.

Embodiments of the present disclosure provide a method of preparing an organic light-emitting display substrate. As shown in FIG. 4, the organic light-emitting display substrate includes a display area 411 and a plurality of opening areas 412 located in the display area 411. As shown in FIG. 9, the method of preparing the organic light-emitting display substrate includes steps 901 to 906.

At step 901, a flexible substrate is formed on a support substrate, such that the support substrate supports the flexible substrate, where the flexible substrate includes a plurality of openings each of which is located in a respective opening area.

In this embodiment, the support substrate is a rigid support substrate, which supports the flexible substrate. For example, the support substrate may be a glass substrate, but is not limited thereto.

Figure 10:
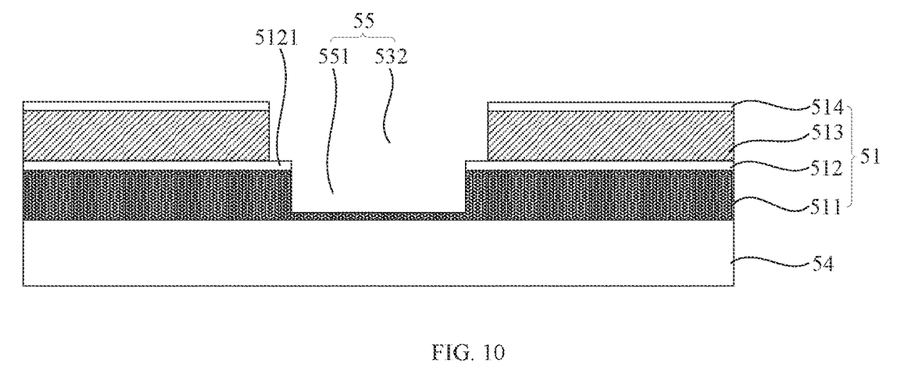
FIGS. 10-13 are schematic diagrams illustrating intermediate structures generated in the process of preparing an organic light-emitting display substrate according to an embodiment of the present disclosure.

In this embodiment, as shown in FIG. 10, the opening 55 is a blind hole. A distance between a bottom surface of the opening 55 and a surface of the flexible substrate 51 in contact with the support substrate 54 is greater than zero.

In this embodiment, as shown in FIG. 10, the flexible substrate 51 may include a first organic layer 511, a first barrier layer 512, a second organic layer 513, and a second barrier layer 514. The first organic layer 511 may be located on the support substrate 54, the first barrier layer 512 may be located on a side of the first organic layer 511 away from the support substrate 54, the second organic layer 513 may be located on a side of the first barrier layer 512 away from the support substrate 54, and the second barrier layer 514 may be located on a side of the second organic layer 513 away from the support substrate 54.

In this embodiment, the bottom surface of the opening 55 may be located in the first organic layer 511. The bottom surface of the opening 55 may be located between a surface of the first organic layer 511 away from the support substrate 54 and a surface of the first organic layer 511 close to the support substrate 54. However, the bottom surface of the opening 55 may also be located in the first barrier layer 512.

In this embodiment, as shown in FIG. 10, the opening 55 may include a first hole portion 551 and a second hole portion 532. The first hole portion 551 is a blind hole that penetrates through the first barrier layer 512 and does not penetrate through the first organic layer 511, and the second hole portion 532 is a through hole that penetrates through the second barrier layer 514 and the second organic layer 513.

In this embodiment, as shown in FIG. 10, the first hole portion 551 may have a hole size smaller than that of the second hole portion 532 such that the first barrier layer 512 is formed with an exposed portion 5121 that is not covered by the second organic layer 513.

In this embodiment, an orthographic projection of the opening 55 on the support substrate 54 may be a circle or N-polygon, where N is an integer greater than 2.

At step 902, an organic light-emitting device layer is formed on a side of the flexible substrate away from the support substrate, such that the organic light-emitting device layer is located in the display area.

In this embodiment, the organic light-emitting device layer may include pixel circuits and organic light-emitting devices. The pixel circuits are located on a side of the flexible substrate 51 away from the support substrate 54, and the organic light-emitting devices are located on a side of the pixel circuits away from the support substrate 54. The pixel circuit may include a transistor and a capacitor. In a direction from the support substrate 54 toward the flexible substrate, the organic light-emitting device layer may include a semiconductor layer, a first gate insulating layer, a first metal layer, a second gate insulating layer, a second metal layer, an interlayer dielectric layer, a third metal layer, a planarization layer, a fourth metal layer, a pixel definition layer, and support pillars stacked sequentially. The first metal layer may include the first gates of the transistors, the second metal layer may include the second gates of the transistors and the first electrodes of the capacitors, the third metal layer may include sources and drains of the transistors and the second electrodes of the capacitors, and the fourth metal layer may include anodes of the organic light-emitting devices.

In this embodiment, after the interlayer dielectric layer is formed, the flexible substrate 51 may be etched to obtain the openings 55.

In this embodiment, the first barrier layer 512 may be made of silicon oxide. However, the first barrier layer 512 may also be made of silicon nitride or silicon oxynitride.

In this embodiment, the second barrier layer 514 may be made of silicon oxide. However, the second barrier layer 514 may also be made of silicon nitride or silicon oxynitride.

In this embodiment, the first organic layer 511 may be made of PI, but is not limited thereto.

In this embodiment, the second organic layer 513 may be made of PI, but is not limited thereto.

In this embodiment, etching the flexible substrate 51 to obtain the openings 55 may include the following operations.

Firstly, the second barrier layer 514 and the second organic layer 513 are etched to obtain the second hole portions 532.

An etching gas used in etching the second barrier layer 514 is a fluorine-containing gas with oxygen gas as an auxiliary gas, for example, a gas mixture of carbon tetrafluoride ($CF_4$) and oxygen, a gas mixture of sulfur hexafluoride ($SF_6$) and oxygen, or a gas mixture of trifluoromethane ($CHF_3$) and oxygen.

An etching gas used in etching the second organic layer 513 etches the second organic layer 513 at an etching rate greater than that for the second barrier layer 514, such that an orthographic projection of the second barrier layer 514 on the support substrate 54 covers an orthographic projection of the second organic layer 513 on the support substrate 54, or an area of the orthographic projection of the second barrier layer 514 on the support substrate 54 is larger than an area of the orthographic projection of the second organic layer 513 on the support substrate 54 (not shown in the figures). In this way, a partition structure for the organic light-emitting device layer may be formed on a side of the second barrier layer 514 and the second organic layer 513 close to the opening 55, such that the organic light-emitting device layer is made discontinuous, which is beneficial to blocking a diffusion path of water and oxygen.

In this embodiment, the etching gas used in etching the second organic layer 513 may include oxygen gas, or rather a proportion of the oxygen gas in the etching gas is relatively large and may be much larger than a proportion of other gases.

In this embodiment, the etching gas used in etching the second organic layer 513 may include a second auxiliary gas in addition to the oxygen gas. The second auxiliary gas may include at least one of carbon tetrafluoride ($CF_4$), sulfur hexafluoride ($SF_6$) or trifluoromethane ($CHF_3$), but is not limited thereto. A proportion of the second auxiliary gas is smaller than the proportion of the oxygen gas, such that the etching rate for the second organic layer may be increased.

However, a partition structure may also be provided around the opening area on a side of the second barrier layer 514 away from the flexible substrate 51 to isolate the organic light-emitting device layer and improve the reliability of the encapsulation.

Next, the first barrier layer 512 and the first organic layer 511 are etched to obtain the first hole portions 551.

An etching gas used in etching the first barrier layer 512 is a fluorine-containing gas with oxygen gas as an auxiliary gas, for example, a gas mixture of carbon tetrafluoride ($CF_4$) and oxygen, a gas mixture of sulfur hexafluoride ($SF_6$) and oxygen, or a gas mixture of trifluoromethane ($CHF_3$) and oxygen.

An etching gas used in etching the first organic layer 511 etches the first organic layer 511 at an etching rate greater than that for the first barrier layer 512, such that an orthographic projection of the first barrier layer 512 on the support substrate 54 covers an orthographic projection of the first organic layer 511 on the support substrate 54, or an area of the orthographic projection of the first barrier layer 512 on the support substrate 54 is larger than an area of the orthographic projection of the first organic layer 511 on the support substrate 54 (not shown in the figures). In this way, a partition structure for the organic light-emitting device layer may be formed on a side of the first barrier layer 512 and the first organic layer 511 close to the opening 55, such that the organic light-emitting device layer is made discontinuous, which is beneficial to blocking a diffusion path of water and oxygen.

In this embodiment, the etching gas used in etching the first organic layer 511 may include oxygen gas, or rather a proportion of the oxygen gas in the etching gas is relatively large and may be much larger than a proportion of other gases.

In this embodiment, the etching gas used in etching the first organic layer 511 may include a first auxiliary gas in addition to the oxygen gas. The first auxiliary gas may include at least one of carbon tetrafluoride ($CF_4$), sulfur hexafluoride ($SF_6$) or trifluoromethane ($CHF_3$), but is not limited thereto. A proportion of the first auxiliary gas is smaller than the proportion of the oxygen gas, such that the etching rate for the first organic layer may be increased.

At step 903, an encapsulation layer is formed on a side of the organic light-emitting device layer away from the flexible substrate, such that the encapsulation layer covers the organic light-emitting device layer and the openings, where the encapsulation layer includes first to-be-etched portions, each of which is located in a respective opening and extends in a direction intersecting side walls of the opening.

Figure 11:
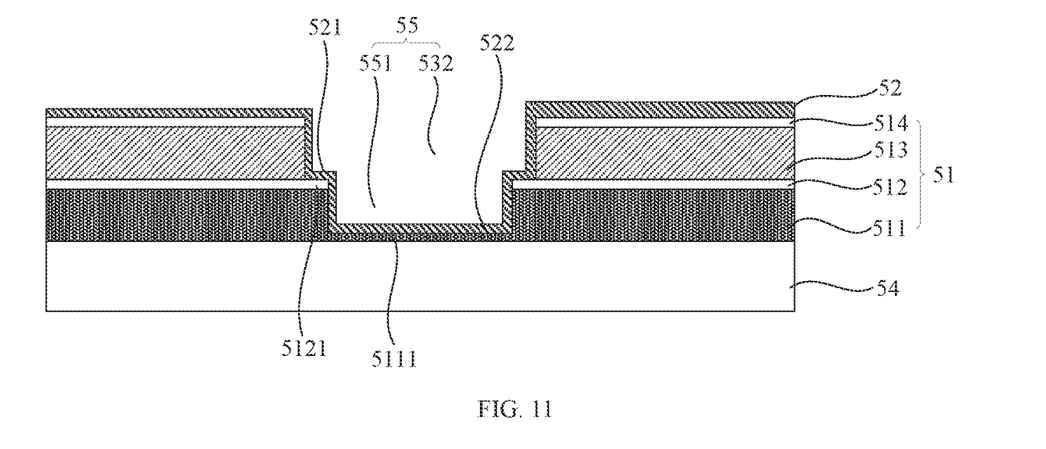

In this embodiment, an intermediate structure as shown in FIG. 11 may be obtained after step 903. As shown in FIG. 11, the encapsulation layer 52 includes the first to-be-etched portions 522, each of which is located in the respective opening 55 and extends in the direction intersecting the side walls of the opening 55, for example, in a direction perpendicular to the side walls of the opening 55. Each of the first to-be-etched portions 522 is located on the bottom surface of the respective opening 55.

Figure 15:
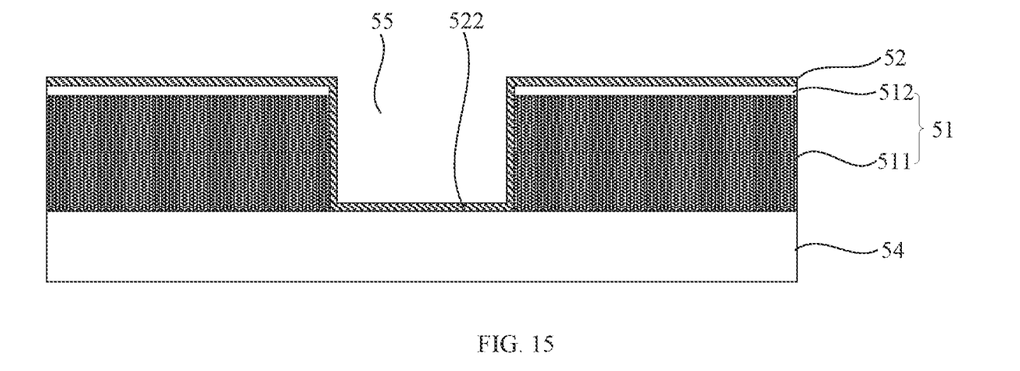

In this embodiment, as shown in FIG. 11, the flexible substrate 51 includes second to-be-etched portions 5111, each of which is located between the bottom surface of the respective opening 55 and the support substrate 54, and orthographic projections of the first to-be-etched portions 522 on the support substrate 54 may coincide exactly with orthographic projections of the second to-be-etched portions 5111 on the support substrate 54. In other embodiments (as shown in FIG. 15, for example), the flexible substrate may not include the second to-be-etched portions.

In this embodiment, the encapsulation layer 52 may include at least one inorganic encapsulation layer. The inorganic encapsulation layer may be made of at least one of silicon nitride, silicon oxide, aluminium oxide, or silicon oxynitride. For example, the at least one inorganic encapsulation layer may include a first inorganic encapsulation layer, a second inorganic encapsulation layer and a third inorganic encapsulation layer stacked sequentially. The first inorganic encapsulation layer is located close to the organic light-emitting device layer, and may be made of silicon nitride, the second inorganic encapsulation layer may be made of silicon oxynitride, and the third inorganic encapsulation layer may be made of silicon nitride.

In this embodiment, the encapsulation layer 52 may include an enclosed protection portion 521 located on a side of the exposed portion 5121 away from the support substrate 54. In this way, the encapsulation layer 52 may be in contact with the first barrier layer 512 such that the second organic layer 513, the second harder layer 514, the organic light-emitting device layer and other film layers may be enclosed by the encapsulation layer 52 and the first barrier layer 512, which can protect the second organic layer 513, the second barrier layer 514 and the organic light-emitting device layer.

At step 904, the first to-be-etched portions are etched to remove the first to-be-etched portions.

In the case that the flexible substrate 51 includes the second to-be-etched portions 5111, the second to-be-etched portions are etched to remove the second to-be-etched portions, at step 905. However, in other embodiments in which the flexible substrate does not include the second to-be-etched portions, step 905 may be omitted.

In this embodiment, the first to-be-etched portions and the second to-be-etched portions may be exposed and etched by using the same mask, i.e., removal of the first to-be-etched portions and removal of the second to-be-etched portions may be done in the same process. In this case, an etching gas used in etching the first to-be-etched portions is different from an etching gas used in etching the second to-be-etched portions.

In this embodiment, portions of the encapsulation layer 52 adhered to the side walls of the openings 55 may not be etched to ensure the integrity of the encapsulation layer 52.

Figure 12:
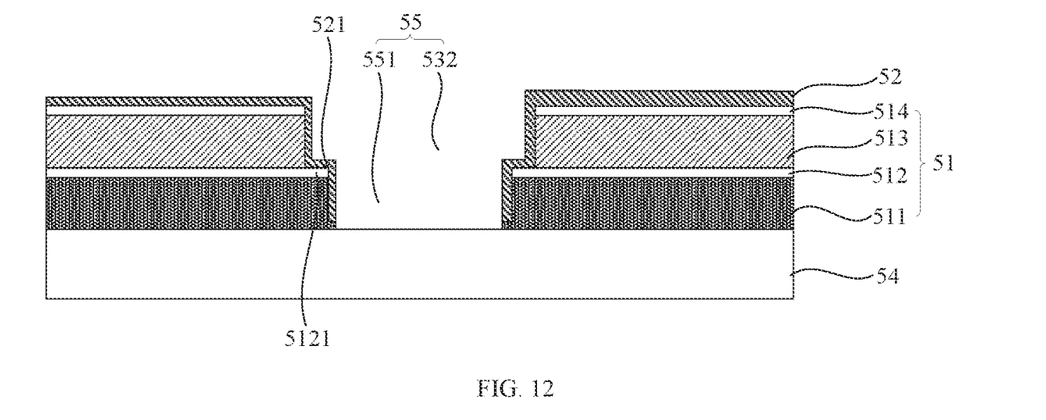

In this embodiment, an intermediate structure as shown in FIG. 12 may be obtained after step 905.

At step 906, the support substrate is peeled off from the flexible substrate to obtain the organic light-emitting display substrate.

Figure 13:
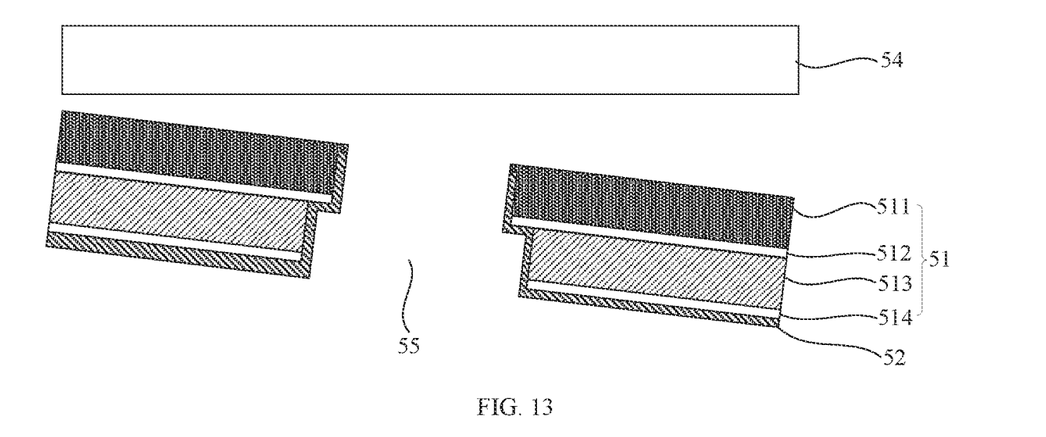

In this step, as shown in FIG. 13, a laser with a wavelength in an ultraviolet band may be used to irradiate a surface of the support substrate 54 away from the encapsulation layer 52 to separate the first organic layer 511 from the support substrate 54, such that the support substrate 54 may be peeled off from the flexible substrate 51 to obtain the organic light-emitting display substrate as shown in FIG. 5.

In this embodiment, a flexible substrate may include openings provided therein. After forming an encapsulation layer on a side of an organic light-emitting device layer away from the flexible substrate, the encapsulation layer covers the organic light-emitting device layer and the openings. The encapsulation layer includes first to-be-etched portions each of which is located in a respective opening and extends in a direction intersecting side walls of the opening. Next, the first to-be-etched portions are etched to remove the first to-be-etched portions, and then the support substrate is peeled off from the flexible substrate to obtain an organic light-emitting display substrate. By removing the first to-be-etched portions located in the openings before peeling the support substrate off from the flexible substrate, portions of the encapsulation layer adhered to the support substrate may be removed, and thus the detect of peeling off of the encapsulation layer when the support substrate is separated from the flexible substrate can be overcome, and the reliability of the encapsulation layer can be improved.

The method of preparing the organic light-emitting display substrate as shown in FIG. 5 according to embodiments of the present disclosure has been described above in detail, and methods of preparing the organic light-emitting display substrates as shown in FIGS. 6-8 according to embodiments of the present disclosure will be briefly described below.

Embodiments of the present disclosure also provide a method of preparing an organic light-emitting display substrate, which is used for preparing the organic light-emitting display substrate as shown in FIG. 6. The method of preparing the organic light-emitting display substrate in this embodiment is substantially the same as the method of preparing the organic light-emitting display substrate shown in FIG. 9, except that the hole size of the first hole portion 551 may be made equal to that of the second hole portion 532 by controlling the etching rate, etching time, or other etching process parameters in the process of etching the flexible substrate 51 to obtain the openings 55.

Embodiments of the present disclosure also provide a method of preparing an organic light-emitting display substrate, which is used for preparing the organic light-emitting display substrate as shown in FIG. 7. The method of preparing the organic light-emitting display substrate in this embodiment is substantially the same as the method of preparing the organic light-emitting display substrate shown in FIG. 9, except that in the process of etching the flexible substrate 51 to obtain the openings 55, the first organic layer 511 and the first barrier layer 512 are etched to obtain the openings 55.

Embodiments of the present disclosure also provide a method of preparing an organic light-emitting display substrate, which is used for preparing the organic light-emitting display substrate as shown in FIG. 8. The method of preparing the organic light-emitting display substrate in this embodiment is substantially the same as the method of preparing the organic light-emitting display substrate shown in FIG. 9, except for those described below.

Figure 14:
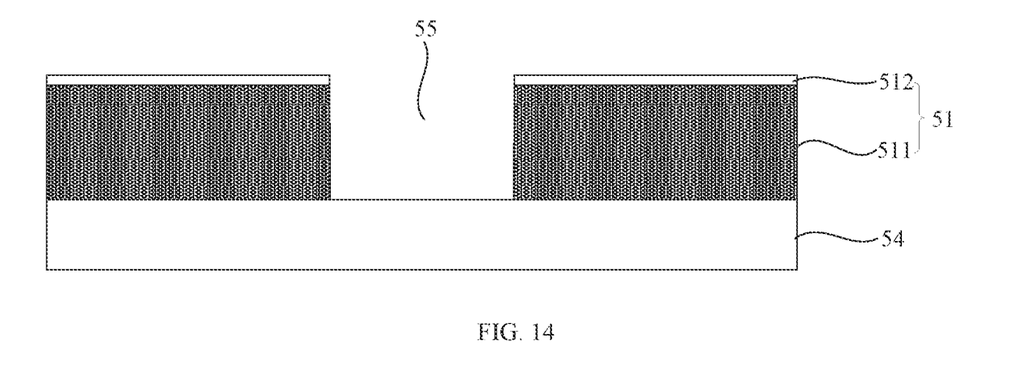
FIGS. 14-16 are schematic diagrams illustrating intermediate structures generated in the process of preparing an organic light-emitting display substrate according to another embodiment of the present disclosure.

As shown in FIG. 14, in the process of etching the flexible substrate 51 to obtain the openings 55, the first organic layer 511 and the first barrier layer 512 are etched to obtain the openings 55, each of which is a through hole that penetrates through the first organic layer 511 and the first barrier layer 512.

An intermediate structure obtained after forming the encapsulation layer 52 on the side of the organic light-emitting device layer away from the flexible substrate 51 is shown in FIG. 15 with the first to-be-etched portions 522 located on the support substrate 54.

Figure 16:
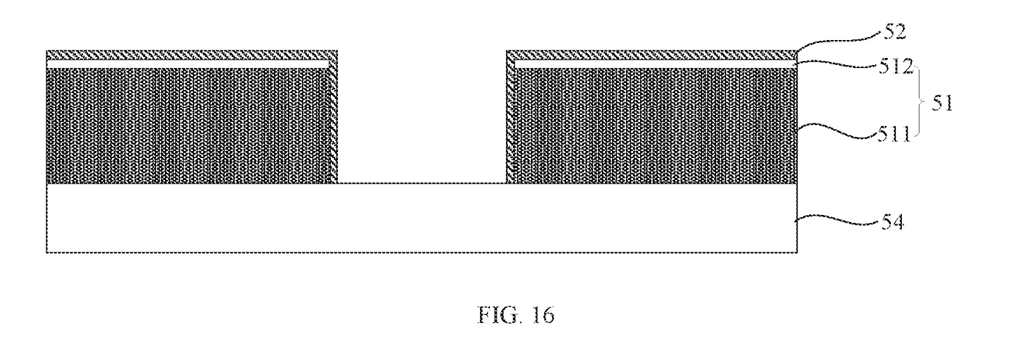

An intermediate structure obtained after etching the first to-be-etched portions 522 to remove the first to-be-etched portions 522 is shown in FIG. 16, where small portions of the encapsulation layer 52 are still adhered to the support substrate 54. However, the encapsulation layer 52 adhered to the support substrate 54 is very few.

In this embodiment, a laser with a wavelength in an ultraviolet band may be used to irradiate a surface of the support substrate 54 away from the encapsulation layer 52 as shown in FIG. 16 to separate the first organic layer 511 from the support substrate 54, such that the support substrate 54 may be peeled off from the flexible substrate 51 to obtain the organic light-emitting display substrate as shown in FIG. 8.

In this embodiment, by removing the first to-be-etched portions located in the openings before peeling the support substrate off from the flexible substrate, an adhesion area of the encapsulation layer to the support substrate may be greatly reduced, and thus the defect of peeling off of the encapsulation layer when the support substrate is separated from the flexible substrate can be overcome, and the reliability of the encapsulation layer can be improved.

Embodiments of the present disclosure also provide an organic light-emitting display apparatus, including the organic light-emitting display substrate as described in any of the above embodiments.

It should be noted that the display apparatus according to the embodiments of the present disclosure may include any product or component with a display function, such as electronic paper, mobile phone, tablet computer, television, notebook computer, digital photo frame, navigator, virtual reality device, augmented reality device, and wearable device.

Forming processes used in the above steps may include, for example, film forming processes such as deposition and sputtering, and patterning processes such as etching.

It should be pointed out that in the drawings, sizes of layers and areas may be exaggerated for clarity of illustration. It should be understood that when an element or layer is referred to as being "on" another element or layer, it can be directly on the other element or layer, or an intervening element or layer may be present. In addition, it should be understood that when an element or layer is referred to as being "under" another element or layer, it can be directly under the other element or layer, or there may be more than one intervening layer or element. It should also be understood that when a layer or element is referred to as being "between" two layers or two elements, it can be the only layer between the two layers or the two elements, or there may be more than one intervening layer or element. Similar reference numerals indicate similar elements throughout.

In the present disclosure, terms "first" and "second" are only used for descriptive purposes, and cannot be understood as indicating or implying relative importance. Term "a plurality of" refers to two or more, unless specifically defined otherwise.

Those skilled in the art will easily conceive of other embodiments of the present disclosure after considering the specification and practicing the disclosure disclosed herein. The present disclosure is intended to cover any variations, uses or adaptive changes of the present disclosure. These variations, uses or adaptive changes follow the general principles of the present disclosure and include common knowledge or conventional technical means in the art that are not disclosed by the present disclosure. The specification and the embodiments are to be regarded as exemplary only, and the true scope and spirit of the present disclosure are pointed out by the following claims.

It should be understood that the present disclosure is not limited to the precise structure that has been described above and shown in the drawings, and various modifications and changes may be made without departing from the scope thereof. The scope of the present disclosure is only limited by the appended claims.

The invention claimed is:

1. A method of preparing an organic light-emitting display substrate comprising a display area and a plurality of opening areas located in the display area, the method comprising:
forming a flexible substrate on a support substrate, such that the support substrate supports the flexible substrate, wherein the flexible substrate comprises a plurality of openings each of which is located in a respective opening area;
forming an organic light-emitting device layer on a side of the flexible substrate away from the support substrate, such that the organic light-emitting device layer is located in the display area;
forming an encapsulation layer on a side of the organic light-emitting device layer away from the flexible substrate, such that the encapsulation layer covers the organic light-emitting device layer and the openings, wherein the encapsulation layer comprises first to-be-etched portions, each of which is located in a respective opening and extends in a direction intersecting side walls of the opening;
etching the first to-be-etched portions to remove the first to-be-etched portions; and
peeling off the support substrate from the flexible substrate to obtain the organic light-emitting display substrate.

2. The method according to claim 1, wherein each of the openings is a blind hole, a distance between a bottom surface of the opening and a surface of the flexible substrate in contact with the support substrate is greater than zero, and each of the first to-be-etched portions is located on the bottom surface of the respective opening;
the flexible substrate comprises second to-be-etched portions, each of which is located between the bottom surface of the respective opening and the support substrate, and orthographic projections of the first to-be-etched portions on the support substrate coincide with orthographic projections of the second to-be-etched portions on the support substrate; and
after etching the first to-be-etched portions to remove the first to-be-etched portions, the method further comprises:
etching the second to-be-etched portions to remove the second to-be-etched portions.

3. The method according to claim 2, wherein the flexible substrate comprises a first organic layer, a first barrier layer, a second organic layer, and a second barrier layer;
the first organic layer is located on the support substrate, the first barrier layer is located on a side of the first organic layer away from the support substrate, the second organic layer is located on a side of the first barrier layer away from the support substrate, and the second barrier layer is located on a side of the second organic layer away from the support substrate; and
the bottom surface of each of the openings is located in the first organic layer or the first barrier layer.

4. The method according to claim 3, wherein when the bottom surface of each of the openings is located in the first organic layer and between a surface of the first organic layer away from the support substrate and a surface of the first organic layer close to the support substrate, the opening comprises a first hole portion and a second hole portion, the first hole portion is a blind hole that penetrates through the first barrier layer and does not penetrate through the first organic layer, and the second hole portion is a through hole that penetrates through the second barrier layer and the second organic layer.

5. The method according to claim 4, wherein the first hole portion has a hole size smaller than that of the second hole portion such that the first barrier layer is formed with a corresponding exposed portion that is not covered by the second organic layer; and
the encapsulation layer comprises a corresponding enclosed protection portion located on a side of the exposed portion away from the support substrate.

6. The method according to claim 4, wherein before forming the organic light-emitting device layer on the side of the flexible substrate away from the support substrate, the method further comprises:
etching the flexible substrate to obtain the openings.

7. The method according to claim 6, wherein etching the flexible substrate to obtain the openings comprises:
etching the second barrier layer and the second organic layer to obtain second hole portions, wherein an etching gas used in etching the second organic layer etches the second organic layer at an etching rate greater than that for the second barrier layer, such that an orthographic projection of the second barrier layer on the support substrate covers an orthographic projection of the second organic layer on the support substrate; and
etching the first barrier layer and the first organic layer to obtain first hole portions, wherein an etching gas used in etching the first organic layer etches the first organic layer at an etching rate greater than that for the first barrier layer, such that an orthographic projection of the first barrier layer on the support substrate covers an orthographic projection of the first organic layer on the support substrate.

8. The method according to claim 7, wherein the first barrier layer is made of silicon oxide, silicon nitride, or silicon oxynitride, and the etching gas used in etching the first organic layer comprises oxygen gas; and
the second barrier layer is made of silicon oxide, silicon nitride, or silicon oxynitride, and the etching gas used in etching the second organic layer comprises oxygen gas.

9. The method according to claim 8, wherein the etching gas used in etching the first organic layer further comprises a first auxiliary gas with a proportion less than that of the oxygen gas, and the first auxiliary gas comprises at least one of carbon tetrafluoride $CF_4$, sulfur hexafluoride $SF_6$, or trifluoromethane $CHF_3$; and
the etching gas used in etching the second organic layer further comprises a second auxiliary gas with a proportion less than that of the oxygen gas, and the second auxiliary gas comprises at least one of carbon tetrafluoride $CF_4$, sulfur hexafluoride $SF_6$, or trifluoromethane $CHF_3$.

10. The method according to claim 4, wherein the first hole portion has a hole size equal to that of the second hole portion.

11. The method according to claim 2, wherein the flexible substrate comprises a first organic layer and a first barrier layer, the first organic layer is located on the support substrate, and the first barrier layer is located on a side of the first organic layer away from the support substrate; and
the bottom surface of the opening is located in the first organic layer and between a surface of the first organic layer away from the support substrate and a surface of the first organic layer close to the support substrate.

12. The method according to claim 1, wherein the opening is a through hole, and the first to-be-etched portions are located on the support substrate.

13. The method according to claim 12, wherein the flexible substrate comprises a first organic layer and a first barrier layer;
- the first organic layer is located on the support substrate, and the first barrier layer is located on a side of the first organic layer away from the support substrate; and
- the opening penetrates through the first organic layer and the first barrier layer.

* * * * *